US009361195B2

(12) United States Patent
Chinnakkonda Vidyapoornachary et al.

(10) Patent No.: US 9,361,195 B2
(45) Date of Patent: Jun. 7, 2016

(54) MIRRORING IN THREE-DIMENSIONAL STACKED MEMORY

(71) Applicant: International Business Machines Corporation, Armonk, NY (US)

(72) Inventors: Diyanesh B. Chinnakkonda Vidyapoornachary, Bangalore (IN); Saravanan Sethuraman, Bangalore (IN); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 66 days.

(21) Appl. No.: 14/538,966

(22) Filed: Nov. 12, 2014

(65) Prior Publication Data
US 2016/0132409 A1 May 12, 2016

(51) Int. Cl.
*G06F 12/00* (2006.01)
*G06F 13/00* (2006.01)
*G06F 11/20* (2006.01)
*G11C 5/02* (2006.01)
*G06F 11/14* (2006.01)

(52) U.S. Cl.
CPC ........ *G06F 11/2069* (2013.01); *G06F 11/1456* (2013.01); *G06F 11/2058* (2013.01); *G11C 5/02* (2013.01); *G06F 2201/84* (2013.01)

(58) Field of Classification Search
None
See application file for complete search history.

(56) References Cited

U.S. PATENT DOCUMENTS

| 6,122,704 | A * | 9/2000 | Hass | G01K 1/028 374/E1.006 |
| 7,916,574 | B1 * | 3/2011 | Solomon | G11C 5/04 365/149 |
| 7,940,591 | B2 * | 5/2011 | Mitchell, Jr. | G11C 5/04 365/211 |
| 7,996,611 | B2 * | 8/2011 | Nakagawa | G06F 11/1464 707/634 |
| 8,516,426 | B2 | 8/2013 | Bose et al. | |
| 8,566,539 | B2 * | 10/2013 | Flemming | G06F 1/206 711/154 |

(Continued)

FOREIGN PATENT DOCUMENTS

| DE | 10221206 A1 | 12/2003 |
| JP | 2004310163 A | 11/2004 |
| WO | 2014006447 A1 | 1/2014 |

OTHER PUBLICATIONS

Lee et al., "Runtime 3-D Stacked Cache Data Management for Energy Minimization of 3-D Chip-Multiprocessors," 2014 15th International Symposium on Quality Electronic Design (ISQED), Mar. 2014, pp. 197-204, © 2014 IEEE.

(Continued)

*Primary Examiner* — Sean D Rossiter
(74) *Attorney, Agent, or Firm* — Scott A. Berger; Robert R. Williams

(57) ABSTRACT

A method for mirroring in three-dimensional-stacked memory includes receiving a plurality of thermal profiles from a plurality of memory chips. The method also includes ranking the plurality of memory chips in a first ranked list of memory chips as a function of the plurality of thermal profiles and forming a first group of memory chips from the plurality of memory chips based on the first ranked list of memory chips. The method also includes forming a second group of memory chips from the plurality of memory chips distinct from the first group of memory chips based on the first ranked list of memory chips. The method also includes pairing a first memory chip from the first group of memory chips and a second memory chip from the second group of memory chips, and mirroring the pairing of memory chips.

8 Claims, 7 Drawing Sheets

(56) References Cited

U.S. PATENT DOCUMENTS

| | | | |
|---|---|---|---|
| 8,797,818 B2 | 8/2014 | Jeddeloh | |
| 8,869,007 B2 | 10/2014 | Cordero et al. | |
| 8,924,661 B1* | 12/2014 | Shachar | G06F 13/1668 365/189.2 |
| 8,954,654 B2* | 2/2015 | Yu | G06F 12/0246 711/103 |
| 8,990,531 B2* | 3/2015 | Ahmad | G06F 12/1009 711/156 |
| 9,047,938 B2* | 6/2015 | Farooq | G11C 13/0004 |
| 2007/0155102 A1 | 7/2007 | Goldbach et al. | |
| 2009/0168505 A1 | 7/2009 | Hanzawa et al. | |
| 2011/0110141 A1 | 5/2011 | Tran | |
| 2011/0310662 A1 | 12/2011 | Scheuerlein | |
| 2013/0138901 A1* | 5/2013 | Cordero | G06F 11/1658 711/162 |
| 2013/0275665 A1* | 10/2013 | Saraswat | G11C 7/04 711/106 |
| 2013/0301207 A1* | 11/2013 | Chun | H05K 1/117 361/679.32 |
| 2014/0043883 A1 | 2/2014 | Leedy | |
| 2014/0241048 A1 | 8/2014 | Farooq et al. | |
| 2014/0268973 A1* | 9/2014 | Connolly | G11C 5/04 365/63 |

OTHER PUBLICATIONS

Chinnakkonda Vidyapoornachary et al., "Mirroring in Three-Dimensional Stacked Memory," U.S. Appl. No. 14/823,383, filed Aug. 11, 2015.

List of IBM Patents or Patent Applications Treated as Related, Signed Aug. 12, 2015, 2 pages.

Chinnakkonda Vidyapoornachary et al., "Mirroring in Three Dimensional Stacked Memory", U.S. Appl. No. 14/556,735, filed Dec. 1, 2014.

List of IBM Patents or Patent Applications Treated as Related.

Bernstein et al., "Interconnects in the Third Dimension: Design Challenges for 3D ICs", DAC '07: Proceedings of the 44th Annual Design Automation Conference, Jun. 2007, pp. 562-567, ACM New York, NY © 2007. DOI: 10.1145/1278480.1278623.

Hsieh et al., "Thermal-Aware Memory Mapping in 3D Designs", DATE '09: Proceedings of the Conference on Design, Automation and Test in Europe, 2009, pp. 1361-1366, European Design and Automation Association (EDAA), Belgium, © 2009.

Kim et al., "Thermal Characterization of Interlayer Microfluidic Cooling of Three-Dimensional Integrated Circuits with Nonuniform Heat Flux", Journal of Heat Transfer, Apr. 2010, vol. 132, Copyright © 2010 ASME.

* cited by examiner

MIRRORING IN THREE-DIMENSIONAL STACKED MEMORY

BACKGROUND

The present disclosure relates to memory in computers, and more specifically, to mirroring in three-dimensional stacked memory.

As memory used in computers increases in speed and capacity, it tends to create more heat and individual memory units may fail. Traditionally, memory chips, such as those of random access memory (RAM), have been laid out in a two-dimensional scheme. As memory increases in speed and capacity, three-dimensional (3D)-stacked memory schemes are becoming more common. 3D-stacked memory is subject to various challenges, including thermal distribution of memory chips within a 3D-stacked memory structure.

SUMMARY

Embodiments of the present disclosure provide for a method, system and computer program product for mirroring in three-dimensional stacked memory.

One embodiment is directed toward a method for mirroring in three-dimensional (3D)-stacked memory. The method includes receiving a plurality of thermal profiles from a plurality of 3D-stacked memory chips. The method also includes ranking the plurality of memory chips in a first ranked list of memory chips as a function of the plurality of thermal profiles. The method also includes forming a first group of memory chips from the plurality of memory chips based on the first ranked list of memory chips. The method also includes forming a second group of memory chips from the plurality of memory chips distinct from the first group of memory chips based on the first ranked list of memory chips. The method also includes pairing a first memory chip from the first group of memory chips and a second memory chip from the second group of memory chips. The method also includes mirroring the pairing of memory chips.

Another embodiment is directed toward a computer program product for 3D-stacked memory mirroring. The computer program product includes a computer readable storage device having a computer readable program stored therein. The computer readable program, when executed on a computing device, causes the computing device to receive a plurality of thermal profiles from a plurality of memory chips. The computer readable program, when executed on a computing device, causes the computing device to rank the plurality of memory chips in a first ranked list of memory chips as a function of the plurality of thermal profiles. The computer readable program, when executed on a computing device, causes the computing device to form a first group of memory chips from the plurality of memory chips based on the first ranked list of memory chips. The computer readable program, when executed on a computing device, causes the computing device to form a second group of memory chips from the plurality of memory chips distinct from the first group of memory chips based on the first ranked list of memory chips. The computer readable program, when executed on a computing device, causes the computing device to pair a first memory chip from the first group of memory chips and a second memory chip from the second group of memory chips. The computer readable program, when executed on a computing device, also causes the computing device to mirror the pair of memory chips.

Another embodiment directed toward a system for mirroring 3D-stacked memory. The system includes a plurality of 3D-stacked memory chips. The system also includes a plurality of memory chip temperature sensors configured to measure the temperature of the plurality of 3D-stacked memory chips and form a plurality of thermal profiles of the plurality of 3D-stacked memory chips. The system also includes a processing unit. The processing unit is configured to assemble the plurality of thermal profiles of the plurality of 3D-stacked memory chips from the plurality of memory chip temperature sensors. The processing unit is also configured to rank the plurality of memory chips in a first ranked list of memory chips as a function of the plurality of thermal profiles. The processing unit is also configured to form a first group of memory chips from the plurality of memory chips based on the first ranked list of memory chips. The processing unit is also configured to form a second group of memory chips from the plurality of memory chips distinct from the first group of memory chips based on the first ranked list of memory chips. The processing unit is also configured to pair a first memory chip from the first group of memory chips and a second memory chip from the second group of memory chips. The processing unit is also configured to mirror the pairing of memory chips.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
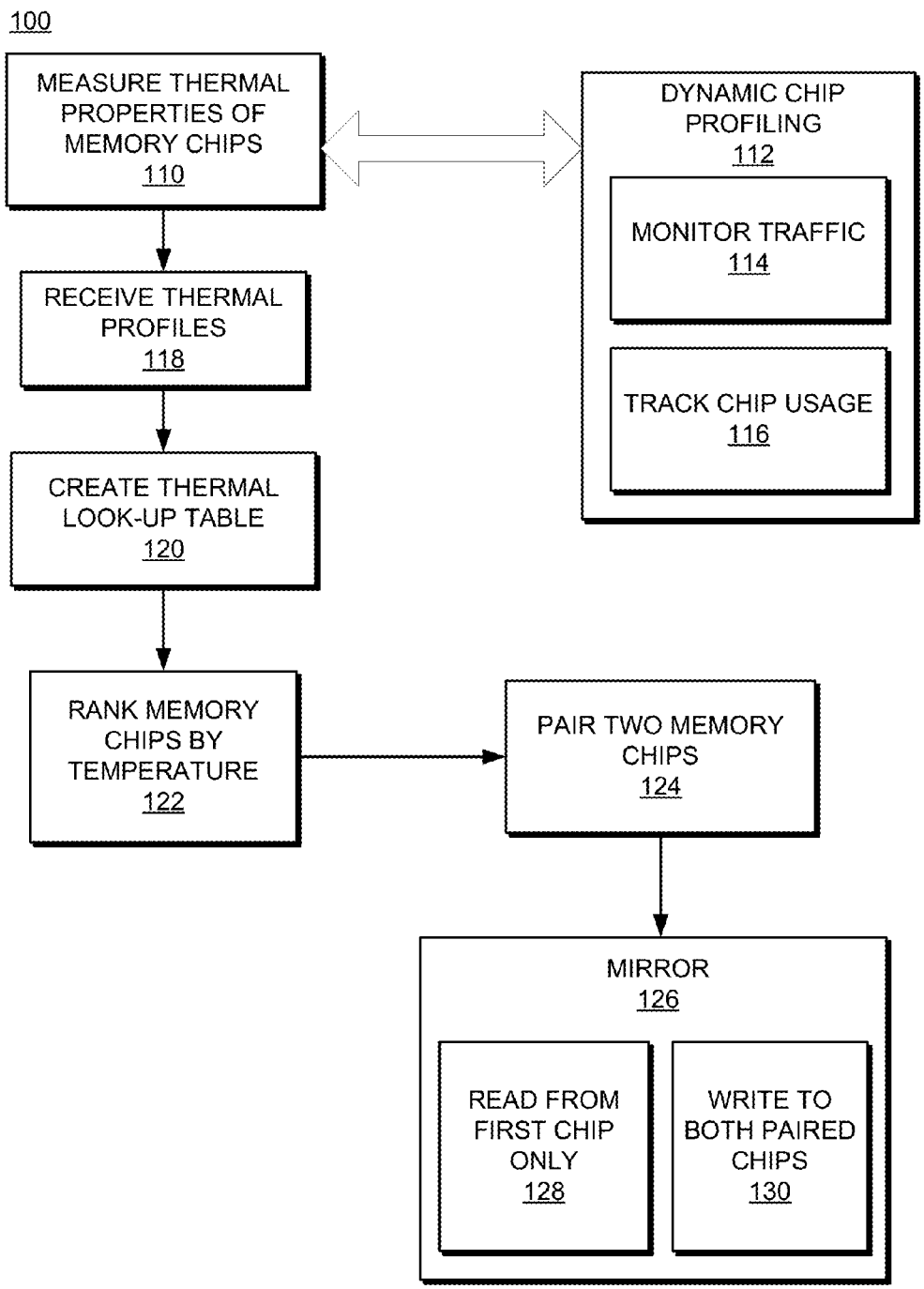
FIG. 1 depicts a flowchart of a method for mirroring 3D-stacked memory, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to mirroring in three-dimensional (3D)-stacked memory, more particular aspects relate to improving memory performance using thermal profiles to efficiently mirror 3D-stacked memory.

3D-stacked memory subsystems employing a mirroring function may aim to optimize the location of mirroring chips in the stack to improve thermal and overall performance, as described herein. Improvements in performance in 3D-stacked memory mirroring may be achieved through sorting and ranking chips within a 3D-stacked memory. The rank statuses (as ranked lists of memory chips based on thermal profiles) may then be employed to efficiently use each memory chip, while optionally continuously updating usage of each chip in light of updated thermal rank of each chip and applying that information to a future memory cycle. After a first ranked list of memory chips, based on thermal profiles, has been evaluated from a received plurality of thermal profiles, the memory chips may be ranked a second time, after a time has passed. The first ranked list of memory chips may take the form of a first thermal look-up table. The second ranked list may contain a ranked list of memory chips from a coldest temperature to a hottest temperature, and may take the form of a second thermal look-up table.

While the present disclosure is not necessarily limited to such applications, various aspects of the disclosure may be appreciated through a discussion of various examples using this context.

Next-generation server systems demand hardware with very high-speed and large memory capacity in order to cater to constantly growing customer demands. Various separate elements may limit server systems' performance. In terms of memory, existing two-dimensional memory layouts are nearing the practical limit within the planar layout.

3D-stacked memory packaging enables stacking of multiple memory chips connected through through-silicon vias ("TSVs"), which offers both very high memory density and a reduced memory form factor. Additionally, 3D-stacked memory architecture may allow higher density integration than currently exists, and it therefore is likely play an important part in future memory subsystems.

However, 3D-stacked memory also presents various challenges, including challenges related to thermal distribution and individual chip distribution. Utilizing methods and systems by which a thermal distribution within 3D-stacked memory may be measured, memory chips (i.e., memory dies) may be organized and utilized in various ways. The memory chips may be organized and utilized such that heat is more efficiently controlled and each chip's usage is optimized based on its thermal profile and the thermal profiles of other memory chips.

Various challenges may be presented by 3D-stacked memory architecture in aspects pertaining to, for example, the areas of power and thermal. Generally, 3D-stacked memory layouts may include an elevated or increased power per unit area (as compared to a planar layout) as created heat must be transmitted through multiple chips. The multiple, stacked chips may tend to have suboptimal thermal properties, including poor thermal interfaces. Heat may also be concentrated in some areas of the 3D-stacked memory, while other areas may be relatively colder.

For example, in a four-chip stacked memory, each chip's thermal status within the stack is varied mainly because of each memory chip's position in the stack. Typically, the top and bottom chips in the stack connect to package/pins/circuit board and thus have a different and usually better thermal profile compared to two chips located in the middle of the stack, according to this example. An alternative approach of ensuring identical thermal profile across all chips in the stack would require each chip design to be different and this would make chip fabrication complicated, expensive, time-consuming and overall less desirable.

There is also currently a desire to incorporate traditional row-address-strobe ("RAS") functions to ensure availability of reliable data. Mirroring is one such function, in which the memory stores two copies of the same data. Memory mirroring functions separate memory into two separate channels, generally on a memory device. Memory mirroring serves the purpose of creating redundancy in a memory device, where one channel is copied to another channel.

With memory mirroring, one data source, such as a byte, may be accessed from two separate locations, allowing for improvements in reliability and confirmation that no data has been lost due to memory failures. Stated differently, in addition to the write operations, read operations of the mirroring functions, may read from only one source. The one source may be either a main memory chip or backup copy memory chip. As such memory mirroring generally provides protection against single and multiple bit errors. Memory mirroring generally involves performing write operations on both a main memory chip and a backup memory chip.

When level mirroring is enabled across one or more chips within the 3D-stacked memory package to enable RAS for mitigation of chip level fails, then chips that are mirroring would be utilized by only write operations.

In dynamic random access memory ("DRAM"), refresh/read/write operations are the primary contributors to the varying (dynamic) power consumption and therefore also the temperature of the chip. Memory refresh is a fundamental operation required for data retention in volatile DRAM. However, read and write operations (also known simply as "reads" and "writes," respectively) are based on memory workload, including memory traffic and usage.

If chips having hotter thermal profiles (generally chips in the middle of the stack) are chosen for storing the main copy (mirrored) in 3D-stacked memory, then this approach would fail to optimize the overall temperature profile, leading to higher temperatures of various chips because of occurrences of read and write operations. These higher temperatures not only increases the need for more system level cooling, but also has other derivative effects, such as increased chip leakage power and limited temperature margins for throttling.

Considering the drawbacks and limitations in existing 3D-stacked memory, a novel method and approach is desired to choose the chip locations in the stack for mirroring function to optimize memory package thermal and system cooling performance.

In embodiments, the thermal look-up table ("TLT") is a database that contains data including a list of unique memory chips and each memory chip's associated thermal profile, location, and any maximum temperature limits placed on the chips. The database may be sorted or arranged in various arrangements.

In embodiments, the mirror tag field is a set of relational data that includes the relational status of various mirrored memory chips. The mirror tag field may be stored or located within the TLT, the memory controller, or the RAM, according to various embodiments.

In embodiments, vital product data ("VPD") may include a collection of informational data associated with a particular set of hardware or software that is stored on a hard disk or other device. The VPD may allow a device to be administered at a system or network level. Information includes in a VPD may include, but is not limited to, product model numbers, unique serial numbers, product release levels, maintenance levels, or any other information specific to a device type. VPD may include user-defined information, according to various embodiments. Collection or use of VPD may allow the status of a network or computer system to communicate and provide service more quickly. VPD may be burned onto electronically erasable read only memory ("EEPROM") associated with various hardware components, or may be queries through integer-integrated circuit ("I2C") buses or devices.

In embodiments, a memory controller is a digital circuit which manages the flow of data going to and from the computer's main memory. It can be a separate chip or integrated into another chip, such as on the die of a microprocessor.

In embodiments, for a given cooling capacity (e.g., air flow or heat dissipation), each memory chip in the stack will have a thermal profile depending on its location in the stack. The static thermal profile may be generated before analyzing the temperature distribution, according to various embodiments. A particular static thermal profile does not update once it is created and is referred to herein as a static thermal profile.

In embodiments, during memory runtime conditions, based on traffic and usage (e.g., how long), the thermal profile of each memory chip will vary. The time-varying thermal profile is the dynamic thermal profile. For example, a dynamic thermal profile management scheme may set a maximum temperature for any chips, or may redistribute usage of chips to maintain a roughly equal temperature across all chips.

This disclosure can be employed in various 3D-based technologies, including, but not limited to, 3D storage ("3DS"), 3D-stacked memory, advanced memory cubes, and hybrid memory cubes.

FIG. 1 depicts a flowchart of a method 100 for mirroring 3D-stacked memory, according to various embodiments.

A memory controller measures thermal properties of memory chips 110. The memory controller may utilize a memory buffer, according to various embodiments. The thermal properties of the memory chips may be measured by various sensors, including thermometers or infrared sensors. The thermal properties of each memory chip may be measured individually, so that there are measured thermal properties for each individual memory chip.

Measuring the thermal properties of the memory chips only once, which is known as static chip profiling, may be suboptimal, according to various embodiments. If there is a desire to continuously optimize the 3D-stacked memory, the memory controller may utilize dynamic chip profiling operation 112. Dynamic chip profiling may continuously or repeatedly update various chips' thermal properties over time as the memory chips are utilized, according to various embodiments.

The dynamic profile may be represented by the following formula:

DP=SP+RC, where DP denotes dynamic profile, SP denotes static profile, and RC denotes runtime conditions.

In this way, a static thermal profile may act as a reference frame, and the dynamic thermal profile may utilize one or more static thermal profiles in its continuous or repeated updates, for example, by re-measuring the thermal properties of the memory chips, wherein the thermal properties, such as temperature, of memory chips may be measured more than one separate time, according to various embodiments.

The memory controller, during dynamic chip profiling at operation 112, may monitor the traffic of the memory chips at operation 114. Traffic to and from the memory chips, via the memory buffer may include the number of signals that are communicated, and from which memory chips. For instance, the memory controller may monitor the traffic of the memory chips and may find that one particular chip is getting used or accessed five times as often (irrespective of how much) as another chip. The gathered data, for various chips, may then be used in the dynamic chip profiling process.

The memory controller may track the usage of the memory chips at operation 116, according to various embodiments. Memory chip usage may include how much a particular memory chip is utilized. This utilization may include the duration and type of work that is done on that particular memory chip. For example, some storage actions in a memory chip may be intensive and create relatively more heat than other tasks, and some tasks may be long in duration but not as intensive or as prone to creation of heat or drawing of power.

Together, the dynamic chip profiling at operation 112, using traffic monitoring at operation 114 and tracking chip usage at operation 116 may create an up-to-date composite profile of a chip, or many chips, according to various embodiments.

The memory controller may receive a plurality of thermal profiles corresponding to a plurality of memory chips at operation 118. The received plurality of thermal profiles may include static thermal profiles, dynamic thermal profiles, both, or variations thereof, according to various embodiments.

The memory controller may then create a thermal look-up table ("TLT") at operation 120 from the thermal profiles received at operation 118. In order to optimize memory performance, a memory controller is proposed to maintain the TLT comprising the following attributes for each 3D-stacked memory structure: chip location, maximum temperature bounds of each chip, and a mirror tag field, as described herein.

During system boot, the TLT, to support activation of the mirroring process, may receive memory chips' thermal profiles and the TLT may be created in this fashion. The TLT may store received profiles from the plurality of memory chips. The TLT may contain vital product data ("VPD"), according to various embodiments. The thermal profile of each memory chip can be contained or stored in a thermal look-up table (TLT) in VPD, according to various embodiments.

Additionally, according to embodiments, a first group of thermal profiles of TLT may correspond to a first half of a list of thermal profiles. According to embodiments, the second group of thermal profiles of the TLT may correspond to a second half of a list of thermal profiles. The memory controller may then read the devices to finds the temperatures or temperature differences between the memory chips. An example 3D-stacked memory may contain, for instance, N unique memory chips.

The memory controller may then rank the N memory chips by temperature at operation 122. The memory controller may access the TLT with information related to the N memory chips and may sort or rank the memory chips based maximum temperature found in the thermal profiles. In DRAM, hottest and coldest memory chips may have proportional heat levels to the amount of usage, or the frequency that data is accessed on each memory chip. For example, a memory chip that frequently is being accessed may be hotter than a memory chip that is rarely being access. Likewise, a coldest memory chip may have the least usage and a hottest memory chip may have the most usage, according to various embodiments. However, cooling and positioning in a stack may also be factors leading to various heat levels. The memory controller may accordingly evaluate a plurality of previous thermal profiles, and re-rank the memory chips from a coldest temperature to a hottest temperature in a second TLT. As used herein, cold, colder, and coldest refer to states of low thermal energy or temperature. As used herein, hot, hotter, and hottest refer to states of high thermal energy or temperature.

The memory controller may form a first group of memory chips from the plurality of memory chips based on a thermal profile of the plurality of thermal profiles. The memory controller may form a second group of memory chips from the plurality of memory chips distinct from the first group of memory chips based on the thermal profile. The TLT may be organized in such a way that the first chip has the hottest measured temperature, second chip has the next hottest measured temperature, so on and the $N^{th}$ chip has the lowest measured temperature. This approach ensures that memory chips in the stack that have a hotter thermal profile will have only write operations, leading to lesser power consumption and a corresponding lower temperature for the hotter memory chips.

The memory controller may then pair two memory chips for mirroring at operation 124. The memory controller may pair a memory chip from the first group of memory chips and a memory chip from the second group of memory chips. In other words, a colder memory chip may be paired with a hotter memory chip. The decision of choosing the chip for pairing can be based on the static thermal profile at the start and the dynamic thermal profile during runtime memory usage. The memory chips may be assigned and paired as follows for mirroring, according to one embodiment. First, mirrored function (main copy) for chips starting with (N/2)+1 through N and update the mirror function tag field. Second, mirroring function (back-up copy) for first chip through N/2 and update the mirror tag field.

The memory controller may then mirror the pairing of memory chips at operation 126 as paired at operation 124. Mirroring the two paired memory chips of each pair of memory chips includes reading and writing to the paired chips according to a predetermined scheme. In various embodiments, a single memory chip of a pair may be read by the memory controller, whereas both memory chips of a pair may be written to.

The memory controller then may then allocate mirroring capable memory chips in the stack (e.g., middle of the memory structure, chip N/2 or N/2+1, etc.) The allocation may utilize the hottest memory chip to be mirrored first. The second memory chip mirrored may be the second hottest memory chip, and so forth. With this approach, a memory controller, through a memory buffer, does fewer writes compared to reads and thereby reduces intensity of usage of middle memory chips in the stack to improve thermal profile.

The memory controller reads from a first memory chip only of the two paired memory chips at operation 128. The memory controller may read the data content of the first memory chip of the paired memory chips, while not reading the other memory chip of the paired memory chips. The first memory chip may be the hotter of the two paired memory chips, according to various embodiments. As described herein, asymmetrically reading and writing of the two paired memory chips, may allow for more methodical and efficient allocation of memory chip usage and a better thermal equilibrium and distribution of the memory structure and 3D-stacked memory overall.

The memory controller also writes to both paired memory chips at operation 130. Both paired memory chips are written because either of the paired memory chips may be read during a read operation, depending on the circumstance. The two paired memory chips are written with identical data to each other. The second memory chip of the pairing of memory chips may therefore be written to and read from, in contrast to the first memory chip which may be only written, not read.

Figure 2:
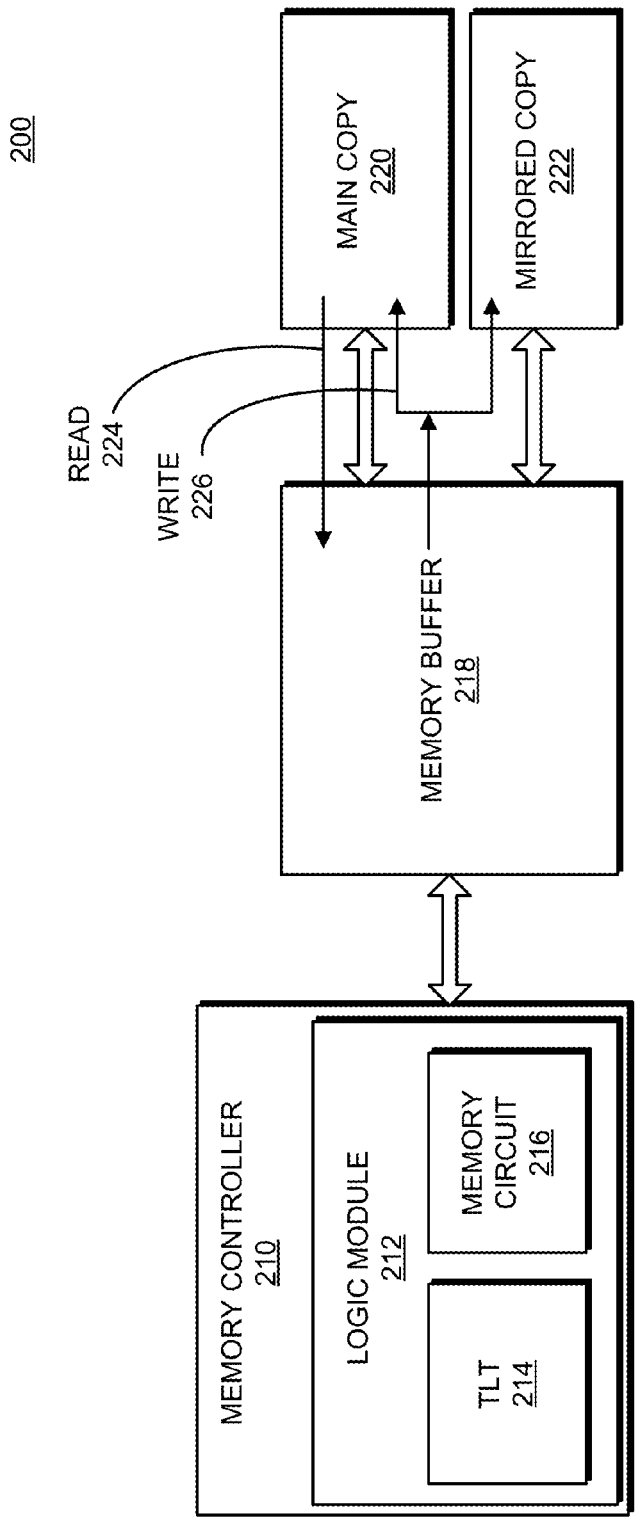
FIG. 2 depicts a block diagram of a method for mirroring 3D-stacked memory, according to various embodiments.

FIG. 2 depicts a block diagram of a method 200 for mirroring 3D-stacked memory, according to various embodiments.

The memory controller 210 may include a logic module 212, a TLT 214, and one or more memory circuits 216, according to various embodiments. The memory controller 210 may communicate with the memory chips, including main copy 220 and mirrored copy 222, by way of a memory buffer 218, according to various embodiments. The memory buffer 218 may perform read 224 or write 226 operations.

The logic module 212 main be a central processing unit ("CPU") or other processing unit configured to function with computer memory and other computer components, according various embodiments. See description of element 713 in FIG. 7 for additional embodiments and details of logic module 212, as described herein.

The thermal look-up table ("TLT") 214, may be similar to the TLT as described in operation 120 of FIG. 1. The memory controller 210 main contain the TLT 214. Each memory chip's thermal profile may be vital product data ("VPD") stored within the TLT 214, and the thermal profile may be defined in a relative number between the chips or in absolute terms, according to various embodiments. For example, the TLT 214 may store and define thermal profiles in terms the other thermal profiles. For example, memory chip 1 may be identified as being currently hotter than memory chip 2, with the chips defined relative to each other and other memory chips in the memory structure. However, according to another embodiment, memory chip 3 may have a thermal profile of 70° C. and memory chip 4 may have a thermal profile of 75° C., and the thermal profiles may be stored in the TLT 214 in absolute terms.

The TLT 214 may be updated based on a unique memory chip identifier (e.g., a custom card identification number ["CCIN"]) and the DRAM location of each dual in-line memory module ("DIMM") in case of 3D-stacked DRAMs in a DIMM. According to various embodiments, the one or more memory circuits 216 may be circuits configured to control memory, and may interface to the logic module 212 and memory buffer 218.

Block diagram 200 may include a memory buffer 218, which may take a variety of forms, according to various embodiments. The memory buffer 218 may be electrically coupled to the memory controller 210 and the main copy 220 and mirrored copy 222 memory chips. For example, to determine which memory chip in a stack is to be mirrored, temperature sensors in each memory chip may be connected together using, e.g., integer-integrated circuit ("I2C") devices. I2C devices and protocols may be examples of memory buffers, or other forms of communication interfaces, according to various embodiments.

The main copy 220 is the memory chip in the pairing of memory chips that has both read and write operations performed on or from it. The main copy 220 may be similar to the second paired memory chip, according to various embodiments. The main copy 220 may accordingly be the colder of the two paired memory chips. The mirrored copy 222 is the memory chip in the pairing of memory chips that has write operations performed on it. The mirrored copy 222 may be similar to the first paired memory chip, according to various embodiments. The mirrored copy 222 may accordingly be the hotter of the two paired memory chips.

The memory read function 224, as described herein, may involve the information on a memory chip being accessed, stored or transferred from the memory chip. The read function may be performed by the memory buffer 218, according to various embodiments. The memory write function 226, as described herein, may involve information being written on a memory chip for later access. The read function may be performed by the memory buffer 218, according to various embodiments. Memory write functions 226 ("writes") go to both the copies. This can be done in a static way and the logic module 212 can decode the same. The 3D-stacked memory's memory controller 210 may include the logic module 212, as discussed herein. The logic module 212 may control functions of the memory chips within the 3D-stacked memory. During system boot, or initial program load ("IPL"), the logic module 212 may direct which memory chips, main copy 220 or mirrored copy 222, will be used for mirroring based on the TLT 214. This mirroring may use a static thermal profile described herein, and the logic module 212 may also use dynamic thermal profiles, according to various embodiments.

Figure 3:
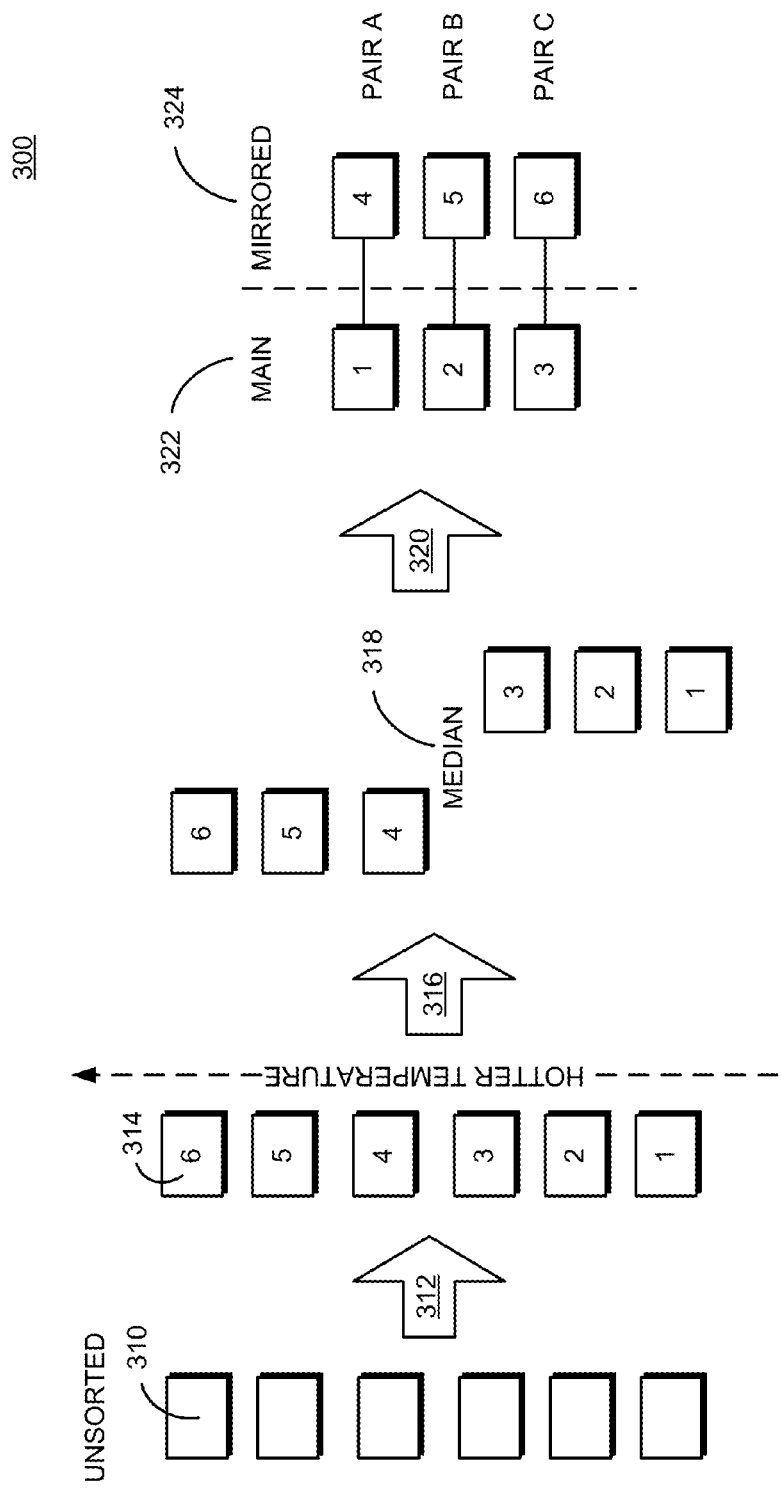
FIG. 3 depicts a representation of a mirroring scheme, according to various embodiments.

FIG. 3 depicts a representation of a mirroring scheme 300, according to various embodiments.

The representation of an embodiment shown of a mirroring scheme 300 is for illustrative purposes only and may not be drawn to scale. The mirroring scheme 300 is represented in four operations, each of which illustrates a stage in the disclosure herein, according to various embodiments.

A plurality of unsorted memory chips is provided at 310. The memory chips may be from a 3D-stacked memory structure. The plurality of memory chips may be ranked from coldest to hottest chip temperature at operation 312 based on memory chips' thermal profiles. After the memory chips are ranked from coldest to hottest chip temperature 312, the memory chips may be ranked and labeled 314 numerically, or otherwise. According to one embodiment, chips labeled with smaller integers represent memory chips with colder temperatures. For example, the hottest memory chip may be labeled "6", the second hottest may be labeled "5," and so forth with the coldest memory chip being labeled "1," according to various embodiments.

The median of the ranked memory chips 314 may be determined at operation 316. For an even number of memory chips, the memory chip at the median+1 may be used instead of the true median (as that would lie between two memory chips), according to various embodiments. The median 318 may effectively separate a hotter half of memory chips from a colder half of memory chips. A median memory chip 314 may correspond to a median thermal profile, according to various embodiments.

The memory controller may assign the memory chips colder than the median to the group of main memory chips and assign the memory chips hotter than the median to the group of mirrored memory chips at operation 320. According to embodiments, various pairs may be formed. A first pair, ("Pair A") is shown containing memory chips labeled "1" and "4." Two more pairs are also depicted.

After separating the ranked memory chip into the hotter half and the colder half, the two halves of memory chips may be assigned two corresponding groups of "mirrored" 324 and "main," 322 respectively. The group of main memory chips 322, according to this embodiment, contain chips "1," "2," and "3." The group main memory chips 322 may correspond to the colder memory chips of the original ranking of memory chips at 314. The group of mirrored memory chips 324, according to this embodiment, contains the remaining memory chips, "4," "5," and "6." The group of mirrored memory chips may correspond the hotter memory chips of the original ranking of memory chips at 314.

By creating the various pairs and the executing the mirroring operations accordingly, the memory chips' heat distribution may allow the hottest memory chips to cool, while utilizing presently colder memory chips to be utilized more frequently or more intensely. In so doing, the thermal distribution among various memory chips may tend to be more balanced across all the memory chips in the stack.

Figure 4:
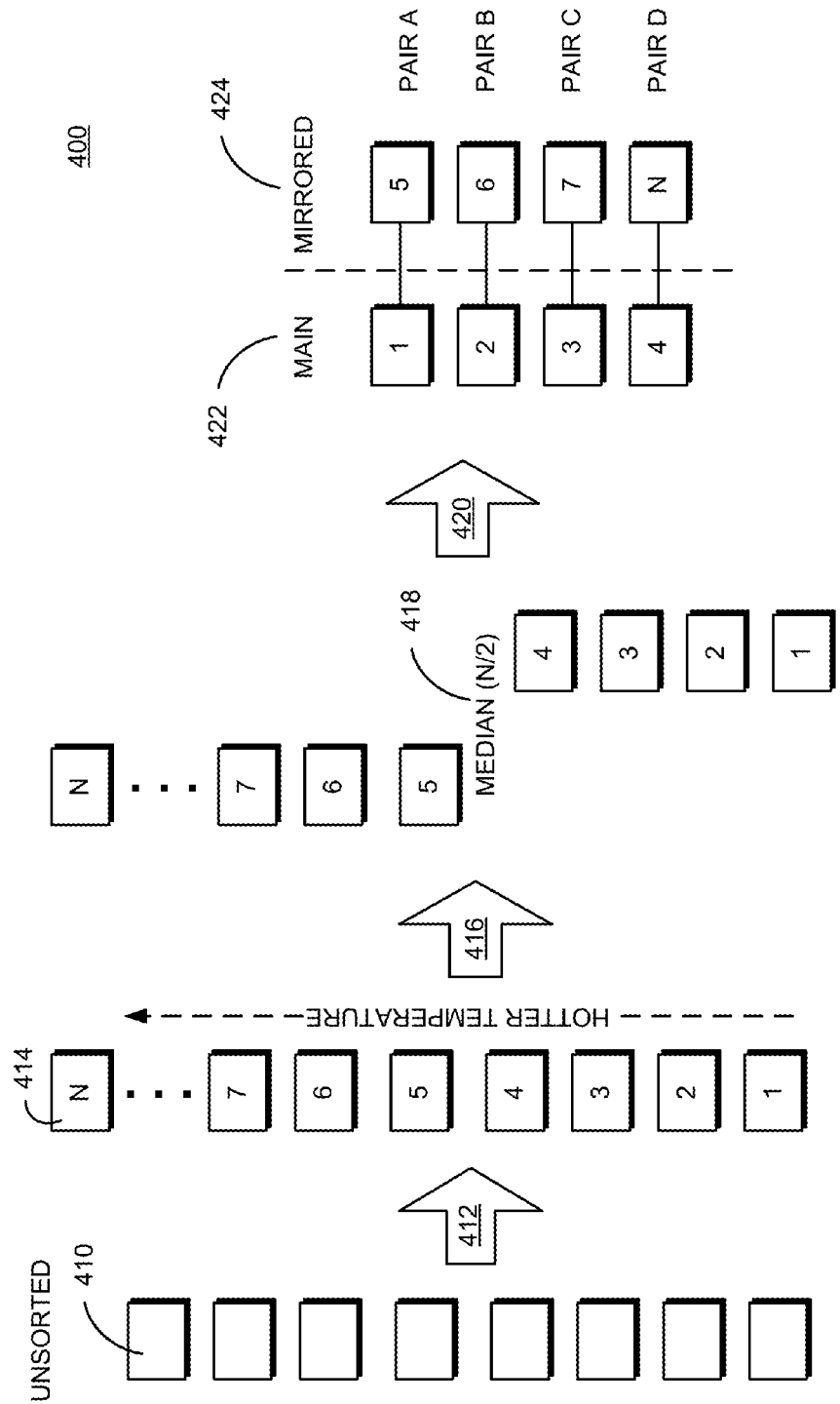
FIG. 4 depicts another representation of a mirroring scheme, according to various embodiments.

FIG. 4 depicts another representation of a mirroring scheme 400, according to various embodiments.

According to embodiments, the plurality of memory chips may include N memory chips, from 1 to N, with 1 corresponding to the memory chip having the coldest temperature and N corresponding to the memory chip having a hottest temperature. The memory chip from the first group of memory chips may be the median ranked (N/2)+1 memory chip of the N memory chips; and the memory chip from the second group of memory chips may be the first memory chip of the N memory chips.

The representation of an embodiment shown of a mirroring scheme 400 is for illustrative purposes only and may not be drawn to scale. The mirroring scheme 400 is represented in four steps, each of which illustrates a stage in the disclosure herein, according to various embodiments.

A plurality of unsorted memory chips is provided at 410. The memory chips may be from a 3D-stacked memory structure. The plurality of memory chips may be ranked from coldest to hottest memory chip temperature at operation 412 based on memory chips' thermal profiles. After the memory chips are ranked from coldest to hottest chip temperature 412, the memory chips may be ranked and labeled 414 numerically, or otherwise. According to one embodiment, chips labeled with smaller integers represent memory chips with colder temperatures. For example, the hottest memory chip may be labeled "8," or "N," where N is the number of total memory chips, and the second hottest may be labeled "7," or "N−1," and so forth with the coldest memory chip being labeled "1," according to various embodiments.

The median of the ranked memory chips 414 may be determined at operation 416. For an even number of N memory chips, the memory chip at the median rank +1 may be used instead of the true median (as that would lie between two memory chips), according to various embodiments. The median 418 may effectively separate a hotter half of memory chips from a colder half of memory chips.

The memory controller may assign the memory chips colder than the median to the group of main memory chips and assign the memory chips hotter than the median to the group of mirrored memory chips at operation 420. According to embodiments, various pairs may be formed. A first pair, ("Pair A") is shown containing memory chips labeled "1" and "5." Three more pairs are also depicted.

After separating the ranked memory chip into the hotter half and the colder half, the two halves of memory chips may be assigned two corresponding groups of "mirrored" 424 and "main," 422 respectively. The group of main memory chips 422, according to this embodiment, contain memory chips "1," "2," "3," and "4." The group main memory chips 422 may correspond to the colder memory chips of the original ranking of memory chips at 414. The group of mirrored memory chips 424, according to this embodiment, contains the remaining chips, "5," "6," "7," and "8." The group of mirrored memory chips may correspond the hotter memory chips of the original ranking of memory chips at 414.

Figure 5:
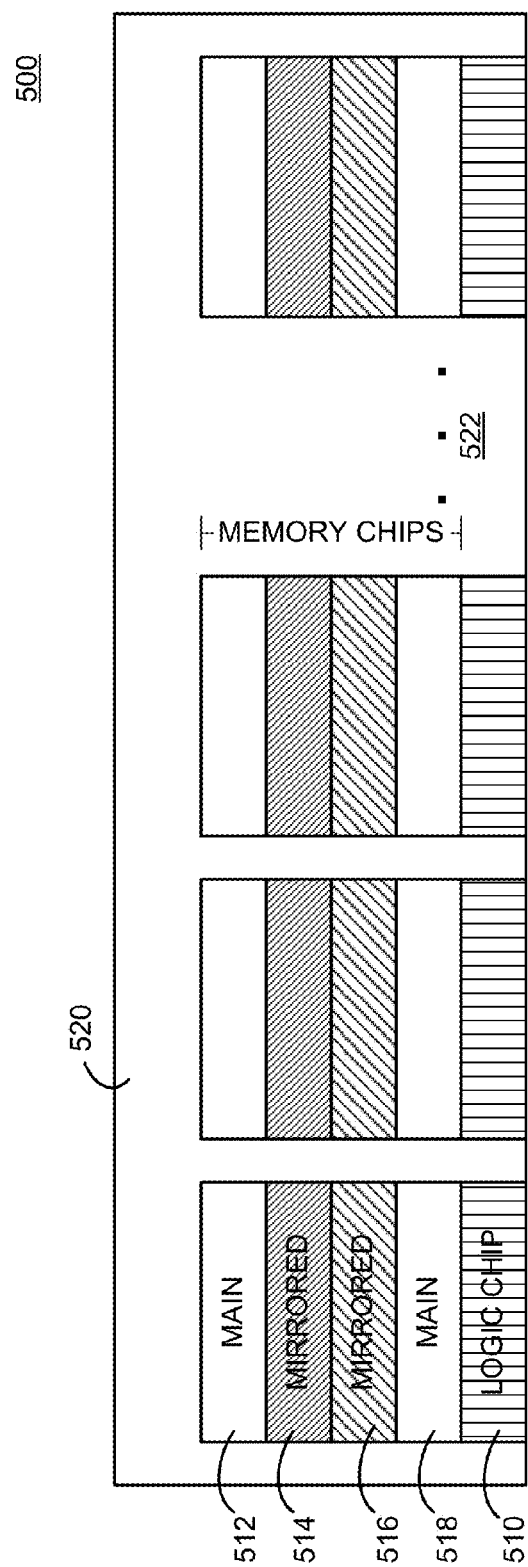
FIG. 5 depicts a side view of a 3D-stacked memory, according to various embodiments.

FIG. 5 depicts a side view of a 3D-stacked memory 500, according to various embodiments. Various memory chips are shown in a stack, including four memory chips and one logic chip in this embodiment. The logic chip may be a processor, memory controller or other chip, according to various embodiments. Main memory chips 322 of FIG. 3 and main memory chips at 422 may correspond to main memory chips 512 and 518 according to FIG. 5. Mirrored memory chips 324 of FIG. 3 and 424 of FIG. 4 may correspond to mirrored memory chips 514 and 516 according to FIG. 5.

The memory chips may be stacked vertically in at least one 3D-stacked memory chip stack. A logic chip 510 may be located at the base of the 3D-stacked memory. A top memory chip 512 may be a main memory chip, and may be located at the top of the 3D-stacked memory 500. A first middle memory chip 514 may be a mirrored memory chip, and may be located below the top memory chip 512. A second middle memory chip 516 may be a mirrored memory chip, and may be located above a bottom memory chip 508.

The bottom memory chip 508 may be located above the logic chip 510, and may be located below the second middle memory chip 516. A gap fill, dielectric region 520 may surround any exposed faces of any memory chips or the logic chip, according to various embodiments. The gap fill may be any suitable dielectric material or materials, including silicon nitride (SiN), among others. According to various embodiments, there may be any number of 3D-stacked memory stacks, including memory chips and a logic chip per stack.

Figure 6:
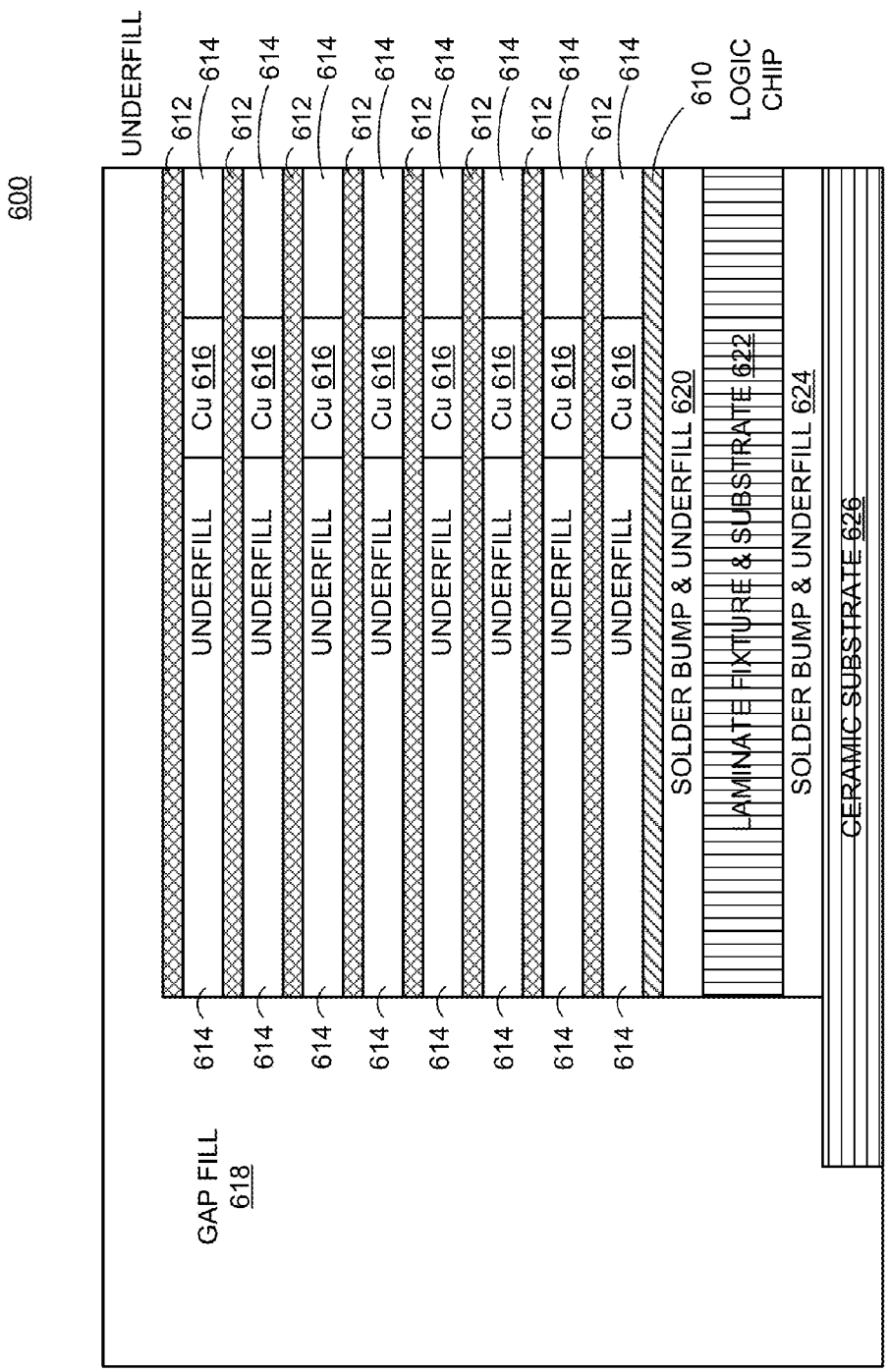
FIG. 6 depicts a side view of a 3D-stacked memory, according to various embodiments.

FIG. 6 depicts a side view of a 3D-stacked memory 600, according to various embodiments.

The memory chips may be stacked vertically in at least one 3D-stacked memory chip stack. This FIG. may show a 3D-stacked memory structure similar to those shown in FIG. 5, but in greater detail. A logic chip 610 may be located at the base of the 3D-stacked memory chips 612, and may be located between a solder bump and underfill 620 below and an underfill and copper (Cu) conduit (i.e., through-silicon-via) 616 above.

Memory chips 612 are shown, stacked with underfill 614 and vias 616 in between, and gap fill 618 on the end and top of the stack. In this depiction, eight memory chips 612 are represented, along with one logic chip 610 at the base of the memory chips. However, more or fewer memory chips 612 may be employed, according to various embodiments. Underfill regions 614 for be located between the memory chips 612, and may surround the vias 616. The underfill regions 614 may contact the gap fill region 618, according to various embodiments.

Copper through-silicon-via ("TSV") regions 616 may couple the memory chips 612 to one another, and may couple the lowest memory chip 612 with the logic chip 610. The TSV regions may be surrounded by underfill regions 614, according to various embodiments. A gap fill region 618 may fill remaining space adjacent and surround the 3D-stacked memory and substrate. The gap fill region 618 may be a dielectric material, including silicon nitride (SiN), among others. A first solder bump and underfill region 620 may lie below the logic chip 610, in a vertical arrangement. A laminate fixture and substrate 622 may lie below the solder bump and underfill region 620. A second solder bump and underfill region 624 may be located below the laminate fixture and substrate 622. A ceramic substrate 626 may lie at the base of the 3D-stacked memory structure, and may be wider than the solder bump and underfill layer 624, above.

Figure 7:
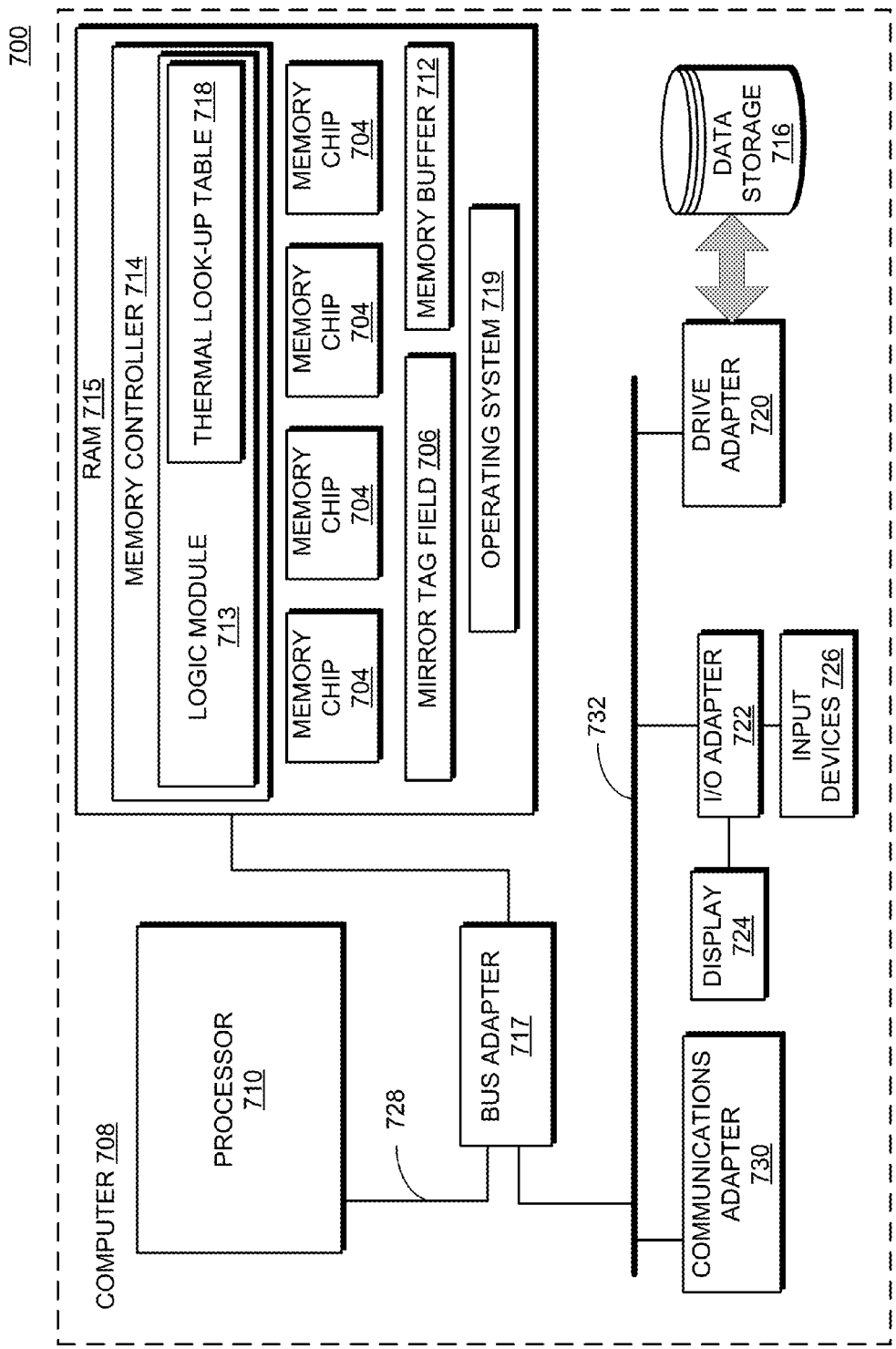
FIG. 7 depicts a 3D-stacked memory system, according to various embodiments.

FIG. 7 illustrates a block diagram of automated computing machinery 700, according to various embodiments. The computing machinery may include example computer 708 useful in performing aspects of the disclosure, according to various embodiments. The computer 708 of FIG. 7 includes at least one computer processor 710 or central processing unit ("CPU") as well as random access memory 715 (RAM) which is connected through bus adapter 717 to processor 710 and to other components of the computer 708. The computing machinery 700 or the processor 710 may include one or more computer processing circuits.

The RAM 715 may include a memory controller 714. The memory controller may controller various functions of the computer's 708 RAM 715, according to various embodiments. The memory controller's instructions may be stored to or read from data storage 716, which may be a hard disk drive, according to various embodiments. The memory controller's communications may be received from various modules located in the memory controller 714.

The RAM 715 may include a memory buffer 712. The memory buffer 712 may serve as a buffer for communication between the memory controller 714 or a memory logic chip 713 and the one or more memory chips 704. The memory controller's 714 instructions may be populated into the data storage 716. The memory controller 714 may access a mirror tag field 706, and may contain a thermal look-up table 718, according to various embodiments. The mirror tag field 706 and the thermal look-up table 718 may be stored in data storage 716, according to various embodiments.

The RAM 715 may include an operating system 719. Operating systems useful for record filtering according to embodiments of the present disclosure include UNIX®, Linux®, Microsoft XP™, AIX®, IBM's i5/OS™, and others. The operating system 719 is shown in RAM 715, but many components of such software typically are stored in non-volatile memory also, such as, for example, on a disk drive 716.

The computer 708 may also include disk drive adapter 720 coupled through expansion bus 732 and bus adapter 717 to processor 710 (and accompanying thread 702) and other components of the computer 708. Disk drive adapter 720 connects non-volatile data storage to the computer 708 in the form of disk drive 716. Disk drive adapters useful in computers include Integrated Drive Electronics ('IDE') adapters, Small Computer System Interface ('SCSI') adapters, Serial AT Attachment ('SATA'), and others. Non-volatile computer memory also may be implemented for as an optical disc drive, electrically erasable programmable read-only memory (so-called 'EEPROM' or 'Flash' memory), RAM drives, etc.

The data storage 716 may include one or more storage devices in a tiered or non-tiered configuration. The data storage 716 may include one or more memory chip thermal profile inputs that are received by the application and stored for later use by the memory controller 714 through RAM 715.

The example computer 708 may include one or more input/output (I/O) adapters 722. I/O adapters implement user-oriented input/output through, for example, software drivers and computer hardware for controlling output to display devices such as computer display screens 724, as well as user input from user input devices 726 such as keyboards, mice, styli, or touchscreens, according to various embodiments. The example computer 708 may include a video adapter at 722, which is an example of an I/O adapter specially designed for graphic output to a display device 724 such as a display screen or computer monitor. The video adapter (I/O) would be connected to processor 710 through a bus adapter 717, and the front side bus 728, which is also a high-speed bus.

The example computer 708 includes a communications adapter 730 for data communications with other computers, for example, mobile devices, and for data communications with a data communications network. Such data communications may be carried out serially through RS-232 connections, through external buses such as a Universal Serial Bus (USB), through data communications networks such as IP data communications networks, and in other ways as will occur to those of skill in the art. Communications adapters implement the hardware level of data communications through which one computer sends data communications to another computer, directly or through a data communications network. Examples of communications adapters include modems for wired dial-up communications, Ethernet (IEEE 802.3) adapters for wired data communications network communications, and IEEE 802.77 adapters for wireless data communications network communications.

The descriptions of the various embodiments of the present disclosure have been presented for purposes of illustration, but are not intended to be exhaustive or limited to the embodiments disclosed. Many modifications and variations will be apparent to those of skill in the art without departing from the scope and spirit of the described embodiments. The terminology used herein was chosen to best explain the principles of the embodiments, the practical application or technical improvement over technologies found in the marketplace, or to enable others of skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure is not necessarily limited to such applications, various aspects of the disclosure may be appreciated through a discussion of various examples using this context.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A computer program product for three-dimensional (3D)-stacked memory mirroring comprising: a computer readable storage device having a computer readable program stored therein, wherein the computer readable program, when executed on a computing device, causes the computing device to:
   receive a plurality of thermal profiles from a plurality of memory chips;
   rank the plurality of memory chips in a first ranked list of memory chips as a function of the plurality of thermal profiles;
   form a first group of memory chips from the plurality of memory chips based on the first ranked list of memory chips;
   form a second group of memory chips from the plurality of memory chips distinct from the first group of memory chips based on the first ranked list of memory chips;
   pair a first memory chip from the first group of memory chips and a second memory chip from the second group of memory chips; and
   mirror the pair of memory chips.

2. The computer program product of claim 1, wherein the computer readable program causes the computing device to:
   create a first thermal look-up table based on the received plurality of thermal profiles, and
   store the plurality of thermal profiles for the plurality of memory chips in the first thermal look-up table.

3. The computer program product of claim 1, wherein the computer readable program causes the computing device to:
   measure the plurality of thermal profiles in the first ranked list of memory chips; and
   rank the plurality of memory chips in a second ranked list as a function of the plurality of thermal profiles.

4. The computer program product of claim 1, wherein the computer readable program causes the computing device to mirror the pairing of memory chips by:
   writing to the first memory chip, and
   writing to and reading from the second memory chip.

5. The computer program product of claim 1, wherein the computer readable program causes the computing device to pair a first memory chip from the first group of memory chips and a second memory chip from the second group of memory chips wherein the first memory chip is the coldest memory chip from the first half, and the second memory chip is the coldest memory chip from the second half.

6. A system for mirroring three-dimensional (3D)-stacked memory, comprising:
   a plurality of 3D-stacked memory chips;
   a plurality of memory chip temperature sensors configured to measure the temperature of the plurality of 3D-stacked memory chips and form a plurality of thermal profiles of the plurality of 3D-stacked memory chips; and
   a processing unit, configured to:
      assemble the plurality of thermal profiles of the plurality of 3D-stacked memory chips from the plurality of memory chip temperature sensors,
      rank the plurality of memory chips in a first ranked list of memory chips as a function of the plurality of thermal profiles,
      form a first group of memory chips from the plurality of memory chips based on the first ranked list of memory chips,
      form a second group of memory chips from the plurality of memory chips distinct from the first group of memory chips based on the first ranked list of memory chips,
      pair a first memory chip from the first group of memory chips and a second memory chip from the second group of memory chips, and
      mirror the pairing of memory chips.

7. The system of claim 6, further comprising:
   forming a thermal look-up table, configured to store thermal data related to the plurality of stacked memory chips;
   forming a mirror tag field, configured to store mirroring data related to the plurality of stacked memory chips;
   accessing thermal data from the thermal look-up table; and
   accessing mirroring data from the mirror tag field;
   assigning memory chips for mirroring based on the mirror tag field and thermal look-up table.

8. The system of claim 7, wherein mirroring includes a pairing of memory chips, writing to both of the pairing of memory chips, and reading from one of the pairing of memory chips.

* * * * *